US012658224B2

(12) United States Patent
Park

(10) Patent No.: US 12,658,224 B2
(45) Date of Patent: Jun. 16, 2026

(54) MEMORY DEVICES AND METHODS OF PERFORMING ROW ACCESS COUNTING OPERATIONS

(71) Applicant: SK hynix Inc., Icheon-si (KR)

(72) Inventor: Min Cheol Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 100 days.

(21) Appl. No.: 18/795,750

(22) Filed: Aug. 6, 2024

(65) Prior Publication Data

US 2025/0356888 A1 Nov. 20, 2025

(51) Int. Cl.
G11C 8/08 (2006.01)
G11C 7/08 (2006.01)
G11C 7/10 (2006.01)

(52) U.S. Cl.
CPC .............. G11C 7/1048 (2013.01); G11C 7/08 (2013.01); G11C 7/1093 (2013.01); G11C 8/08 (2013.01)

(58) Field of Classification Search
CPC ....... G11C 7/1048; G11C 7/08; G11C 7/1093; G11C 8/08; G11C 7/06; G11C 7/1051; G11C 7/1078; G11C 7/22; G11C 8/12; G06F 3/0659
See application file for complete search history.

(56) References Cited

U.S. PATENT DOCUMENTS

2024/0038292 A1* 2/2024 Kim .................... G11C 11/4085
2024/0395304 A1* 11/2024 Oh ....................... G11C 11/4096

FOREIGN PATENT DOCUMENTS

KR 1020110037100 A 4/2011

* cited by examiner

*Primary Examiner* — Xiaochun L Chen
(74) *Attorney, Agent, or Firm* — WILLIAM PARK AND ASSOCIATES LTD.

(57) ABSTRACT

A memory device includes a bank configured to store a row counting value corresponding to the number of times each word line is accessed when an active operation is performed, and a column control circuit configured to perform a counting read operation and a counting write operation during a period in which a column selection operation set by a pre-charge command is performed.

25 Claims, 13 Drawing Sheets

MEMORY DEVICES AND METHODS OF PERFORMING ROW ACCESS COUNTING OPERATIONS

CROSS-REFERENCE TO RELATED APPLICATIONS

The present application claims priority under 35 U.S.C. 119(a) to Korean Patent Application No. 10-2024-0065481, filed in the Korean Intellectual Property Office, on May 20, 2024, the entire contents of which application is incorporated herein by reference.

BACKGROUND

1. Technical Field

Some embodiments of the present disclosure relate to methods of performing a row access counting operation and memory devices for the same.

2. Related Art

Memory cells included in a memory device are connected to a plurality of word lines, and at least one of the word lines may be accessed when an active operation is performed. According to the active operation, data stored in the memory cells connected to the accessed word line, among the memory cells included in the memory device, may be transmitted through a bit line pair and sensed and amplified by a bit line sense amplifier. When a specific word line is frequently accessed through the active operation, the charge of the memory cells connected to neighboring word lines may be lost due to the influence of the accessed word line. Accordingly, it is necessary to manage the frequently accessed word line.

SUMMARY

The present disclosure may provide a memory device including a bank configured to store a row counting value corresponding to the number of times each word line is accessed when an active operation is performed, and a column control circuit configured to perform a counting read operation and a counting write operation during a period in which a column selection operation set by a pre-charge command is performed. In the present disclosure, the column control circuit may output the row counting value stored in the bank to a local input/output line pair when the counting read operation is performed, and store an updated row counting value transmitted through the local input/output line pair in the bank when the counting write operation is performed.

In addition, the present disclosure may provide a memory device including a command delay circuit configured to delay a pre-charge command to sequentially generate a set signal, a write signal, and a reset signal, a column control signal generation circuit configured to generate a column control signal for a column selection operation, based on the set signal and the reset signal, a write read signal generation circuit configured to generate a write read signal, based on the pre-charge command and the write signal, and a column control circuit configured to perform a counting read operation and a counting write operation during a period in which a column selection operation is performed based on the column control signal and the write read signal. In the present disclosure, the column control circuit may output a row counting value stored in a bank to a local input/output line pair when the counting read operation is performed, and store an updated row counting value transmitted through the local input/output line pair in the bank when the counting write operation is performed.

In addition, the present disclosure may provide a method of performing a row access counting operation, including generating a column control signal for a column selection operation when a first delay period elapses from a time at which a pre-charge command is generated, performing a counting read operation to output a row counting value stored in a bank in the column selection operation, updating a row counting value that is output during the counting read operation, and performing a counting write operation that stores the updated row counting value back in the bank when a second delay period elapses from a time at which the pre-charge command is generated.

BRIEF DESCRIPTION OF THE DRAWINGS

FIG. 4 illustrates configurations of a row control circuit and a column control circuit according to an embodiment of the present disclosure.

FIGS. 6, 7, 8, 9, and 10 are diagrams illustrating a row access counting operation performed in a memory device according to an embodiment of the present disclosure.

DETAILED DESCRIPTION

In the following description of embodiments, when a parameter is referred to as being "predetermined," a value of the parameter may be determined in advance when the parameter is used in a process or an algorithm. The value of the parameter may be determined when the process or the algorithm starts or may be determined during a period in which the process or the algorithm is executed.

Although the terms "first," "second," "third," and so forth are used herein to describe various elements, these elements should not be limited by these terms. These terms are only used to distinguish one element from another element and are not intended to imply an order or number of elements. Thus, a first element in some embodiments may be termed a second element in other embodiments without departing from the teachings of the present disclosure.

When an element is referred to as "connected" or "coupled" to another element, the element may be directly connected or coupled to the other element or intervening elements may be present. When an element is referred to as "directly connected" or "directly coupled" to another element, no intervening elements are present.

A logic "high" level and a logic "low" level may be used to describe logic levels of electric signals. A signal at a logic "high" level is distinguished from a signal at a logic "low" level. For example, when a signal at a first voltage corresponds to a signal at a logic "high" level, a signal at a second voltage may correspond to a signal at a logic "low" level. In an embodiment, the logic "high" level may be a voltage level that is higher than a voltage level of the logic "low" level. Logic levels of signals may be different or opposite according to the embodiments. For example, a certain signal at a logic "high" level in one embodiment may be at a logic "low" level in another embodiment.

The term "logic bit set" may include a combination of logic levels of bits included in a signal. When the logic level of each of the bits included in the signal is changed, the logic bit set of the signal may be different. For example, when the signal includes two bits, when the logic level of each of the two bits included in the signal is "logic low level, logic low level," the logic bit set of the signal may be the first logic bit set, and when the logic level of each of the two bits included in the signal is "a logic low level and a logic high level," the logic bit set of the signal may be the second logic bit set.

Various embodiments of the present disclosure are described in more detail with reference to the accompanying drawings. The embodiments are described for illustrative purposes only and are not intended to limit the scope of the present disclosure.

Figure 1:
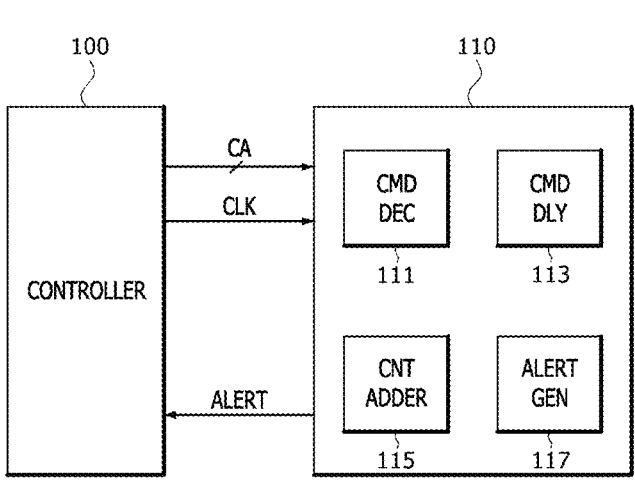
FIG. 1 illustrates a configuration of a memory system according to an embodiment of the present disclosure.

FIG. 1 illustrates a configuration of a memory system 10 according to an embodiment of the present disclosure.

As shown in FIG. 1, the memory system 10 may include a controller 100 and a memory device 110.

The controller 100 may apply a command address CA and a clock signal CLK to the memory device 110 to control the overall operations of the memory system 10. The command address CA may include a number of bits, logic bit sets of which are set for an active operation, a read operation, a write operation, a pre-charge operation, a read operation with the pre-charge operation, and a write operation with the pre-charge operation. The command address CA may be applied in synchronization with the clock signal CLK; however, this is merely an example and the present disclosure is not limited thereto. For example, the pre-charge operation may be performed after the active operation. In another example, the pre-charge operation may be performed after the read operation or write operation is performed after the active operation. In another example, the pre-charge operation may be performed along with the read operation or write operation that is performed after the active operation. The pre-charge operation may be performed to release the word lines accessed in the active operation. Releasing the accessed word line may mean deactivating all word lines (for example, WL in FIG. 4) by a word line driver (for example, 151 in FIG. 4). The controller 100 may receive the alert signal ALERT from the memory device 110. The controller 100 may receive the alert signal ALERT to control the memory device 110 to perform a refresh operation or repair operation to prevent loss of the charge in the memory cells included in a bank (for example, 124 in FIG. 2). However, this is merely an example and the present disclosure is not limited thereto.

The memory device 110 may be electrically connected to the controller 100 to receive the command address CA and the clock signal CLK from the controller 100. The memory device 110 may perform the active operation, the read operation, the write operation, the pre-charge operation, the read operation with the pre-charge operation, and the write operation with the pre-charge operation, based on the command address CA and the clock signal CLK. The memory device 110 may perform a row access counting operation to update a row counting value when a pre-charge command (for example, PCG-BK in FIG. 2) is generated. The row counting value may correspond to the number of times each of the word lines (for example, WL in FIG. 4) is accessed when the active operation is performed, and the row counting value of each of the word lines is stored in at least one of the memory cells connected to the accessed word line. The memory device 110 may store the active address where the active operation is performed when an updated row counting value as a result of the row access counting operation reaches a preset threshold and may generate an alert signal ALERT that is activated when a storage space of an address storage circuit (for example, 143 in FIG. 3) that stores the active address (for example, ACT-ADD in FIG. 3) is full. The memory device 110 may apply the alert signal ALERT to the controller 100. The memory device 110 may include a command decoder (CMD DEC) 111, a command delay circuit (CMD DLY) 113, a counting adder (CNT ADDER) 115, and an alert signal generation circuit (ALERT GEN) 117.

The command decoder 111 may decode the command address CA to generate an active command (for example, ACT-BK in FIG. 2) for the active operation and may generate the pre-charge command (for example, PCG-BK in FIG. 2) for the pre-charge operation.

Figure 2:
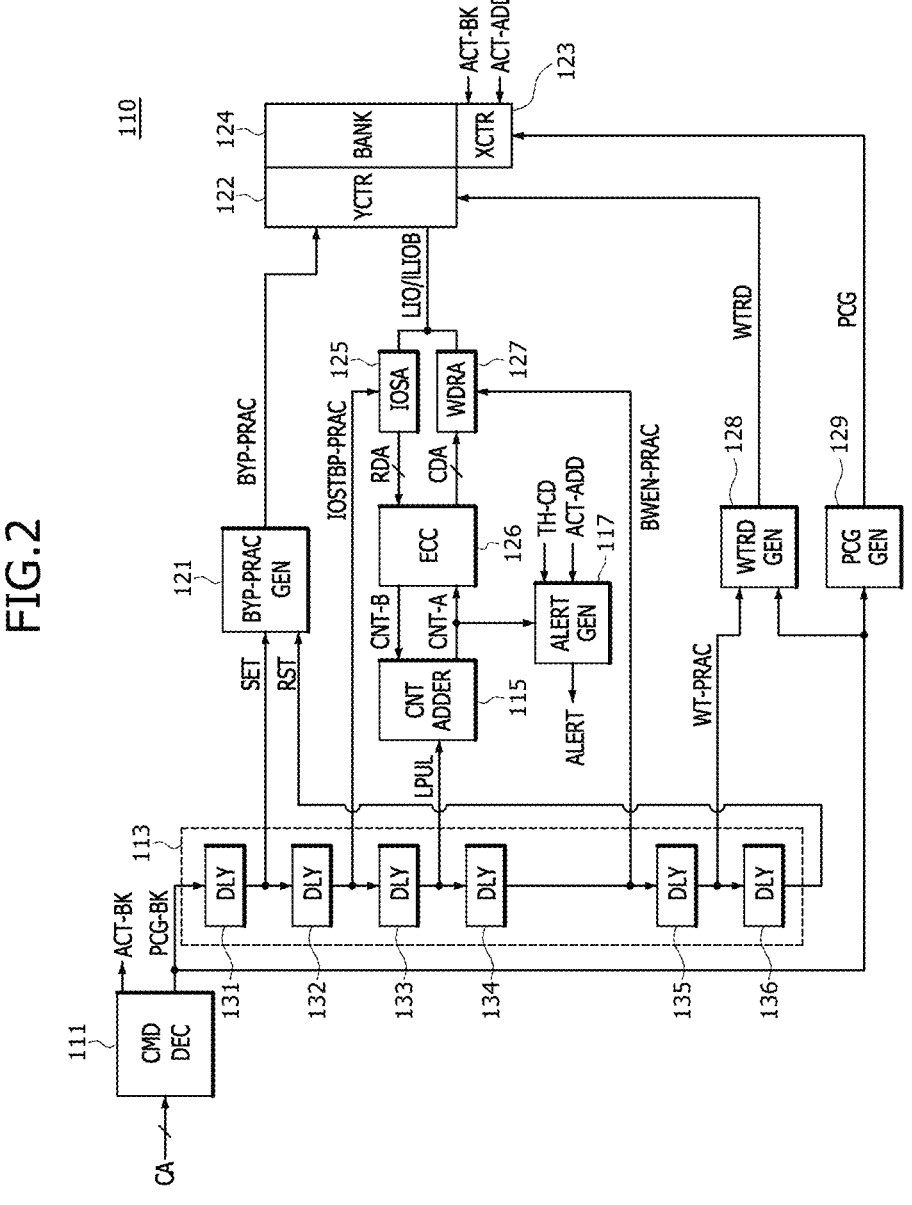
FIG. 2 illustrates a configuration of a memory device according to an embodiment of the present disclosure.

The command delay circuit 113 may delay the pre-charge command (for example, PCG-BK in FIG. 2) generated for the pre-charge operation after the active operation is performed to sequentially generate signals (for example, a set signal SET, an input/output sense amplifier control signal IOSTBP-PRAC, a latch pulse LPUL, a write driver control signal BWEN-PRAC, a write signal WT-PRAC, and a reset signal RST in FIG. 2) for controlling the counting read operation and counting write operation in the row access counting operation.

The counting adder 115 may update the row counting value output from the bank (for example, 124 in FIG. 2) by adding a value (i.e., 1) to the row counting value during the counting read operation and may latch the updated row counting value to output the row counting value to store the row counting value in the bank (for example, 124 in FIG. 2) in the counting write operation.

The alert signal generation circuit 117 may store the active address (for example, ACT-ADD in FIG. 3) in the address storage circuit (for example, 143 in FIG. 3) when the updated row counting value reaches a threshold value in the row access counting operation. The alert signal generation circuit 117 may generate the alert signal ALERT that is activated when the storage space of the address storage circuit (for example, 143 in FIG. 3) is full.

FIG. 2 illustrates a configuration of the memory device 110 of FIG. 1 according to an embodiment of the present disclosure. As shown in FIG. 2, the memory device 110 may include the command decoder (CMD DEC) 111, the command delay circuit (DLY) 113, a column control signal generation circuit (BYP-PRAC GEN) 121, a column control circuit (YCTR) 122, a row control circuit (XCTR) 123, the bank (BANK) 124, an input/output sense amplifier (IOSA) 125, an error correction circuit (ECC) 126, the counting adder (CNT ADDER) 115, the alert signal generation circuit (ALERT GEN) 117, a write driver (WDRV) 127, a write read signal generation circuit (WTRD GEN) 128, and the pre-charge signal generation circuit (PCG GEN) 129.

The command decoder 111 may generate the active command ACT-BK and the pre-charge command PCG-BK, based on the command address CA. The command decoder 111 may decode the command address CA to generate the active command ACT-BK for the active operation and to generate the pre-charge command PCG-BK for the pre-charge operation. Each of the active command ACT-BK and the pre-charge command PCG-BK may be generated for each bank in which the active operation and pre-charge operation are performed independently; however, this is merely an example and the present disclosure is not limited thereto. As an example, the command decoder 111 may generate the pre-charge command PCG-BK for the pre-charge operation after the active operation. As another example, the command decoder 111 may generate the pre-charge command PCG-BK for the pre-charge operation after a read operation or a write operation is performed after the active operation. As further another example, the command decoder 111 may generate the pre-charge command PCG-BK for the pre-charge operation when the read operation with the pre-charge operation or the write operation with the pre-charge operation is performed after the active operation.

The command delay circuit 113 may be electrically connected to the command decoder 111 to receive the pre-charge command PCG-BK from the command decoder 111. The command delay circuit 113 sequentially may generate the set signal SET, the input/output sense amplifier control signal IOSTBP-PRAC, the latch pulse LPUL, the write driver control signal BWEN-PRAC, the write signal WT-PRAC, and the reset signal RST, based on the pre-charge command PCG-BK. The command delay circuit 113 may include delays 131, 132, 133, 134, 135, and 136. The command delay circuit 113 may delay the pre-charge command PCG-BK by a first delay period through the delay 131 to generate the set signal SET. The command delay circuit 113 may delay the set signal SET by a second delay period through the delay 132 to generate the input/output sense amplifier control signal IOSTBP-PRAC. The command delay circuit 113 may delay the input/output sense amplifier control signal IOSTBP-PRAC by a third delay period through the delay 133 to generate the latch pulse LPUL. The command delay circuit 113 may delay the latch pulse LPUL by a fourth delay period through the delay 134 to generate the write driver control signal BWEN-PRAC. The command delay circuit 113 may delay the write driver control signal BWEN-PRAC by a fifth delay period through the delay 135 to generate the write signal WT-PRAC. The command delay circuit 113 may delay the write signal WT-PRAC by a sixth delay period through the delay 136 to generate the reset signal RST. The command delay circuit 113 may generate the set signal SET at a time point at which the first delay period elapses from a time point at which the pre-charge command PCG-BK is generated, may generate the input/output sense amplifier control signal IOSTBP-PRAC at a time point at which the second delay period elapses from a time point at which the set signal SET is generated, and may generate the latch pulse LPUL at a time point at which the third delay period elapses from a time point at which the input/output sense amplifier control signal IOSTBP-PRAC is generated. In addition, the command delay circuit 113 may generate the write driver control signal BWEN-PRAC at a time point at which the fourth delay period elapses from a time point at which the latch pulse LPUL is generated, may generate the write signal WT-PRAC at a time point at which the fifth delay period elapses from a time point at which the write driver control signal BWEN-PRAC is generated, and may generate the reset signal RST at a time point at which the sixth delay period elapses from a time point at which the write signal WT-PRAC is generated. Each of the first to sixth delay periods may be set in various ways depending on the embodiment.

The column control signal generation circuit 121 may be electrically connected to the command delay circuit 113 to receive the set signal SET and the reset signal RST from the command delay circuit 113. The column control signal generation circuit 121 may generate the column control signal BYP-PRAC, based on the set signal SET and the reset signal RST. The column control signal generation circuit 121 may generate the column control signal BYP-PRAC that is activated when the set signal SET is generated and may generate the column control signal BYP-PRAC that is deactivated when the reset signal RST is generated. The column control signal generation circuit 121 may generate the column control signal BYP-PRAC that remains activated during the period from when the set signal SET is generated until the reset signal RST is generated, that is, the period in which the column selection operation for the row access counting operation is performed.

The column control circuit 122 may be electrically connected to the column control signal generation circuit 121 to receive the column control signal BYP-PRAC from the column control signal generation circuit 121. The column control circuit 122 may perform a column selection operation for the row access counting operation, based on the column control signal BYP-PRAC. The column selection operation may refer to an operation that generates a column selection signal (for example, YI<0:63> in FIG. 5) and a counting column selection signal (for example, YI-PRAC in FIG. 4) for connecting a bit line pair (for example, BL/BLB in FIG. 4) with a segment input/output line pair (for example, SIO/SIOB in FIG. 4). The column control circuit 122 may sense and amplify the row counting value that is output from the bank 124 and may be transmitted through the segment input/output line pair (for example, SIO/SIOB in FIG. 4) during the counting read operation, based on the write read signal WTRD to generate a sense amplifier activation signal LSAEN for outputting the row counting value to the local input/output line pair LIO/LIOB. The column control circuit 122 may generate an input/output line switch activation signal IOSWEN to transmit the updated row counting value through the local input/output line pair LIO/LIOB during the counting write operation to the segment input/output line pair SIO/SIOB, based on the write read signal WTRD. The counting read operation may be performed to output the row counting value stored in the bank 124, and the counting write operation may be performed to store the updated row counting value in the bank 124. Both the counting read operation and the counting write operation may be performed during the period in which the column selection operation for the row access counting operation is performed. Updating the row counting value may mean adding the number of times the active word line is accessed, that is, the row counting value by 1.

The row control circuit 123 may be electrically connected to the command decoder 111 to receive the active command ACT-BK from the command decoder 111. The row control circuit 123 may access at least one of the word lines (for example, WL in FIG. 4), based on the active address ACT-ADD, when the active command ACT-BK is generated and the active operation is performed. Accessing the word line may refer to loading the data and row counting value stored in the memory cell connected to the accessed word line among the memory cells included in the bank 124 to the bit line pair BL/BLB and may also be referred to as row access. The row control circuit 123 may be electrically connected to the pre-charge signal generation circuit 129 to receive the pre-charge signal PCG from the pre-charge signal generation circuit 129. The row control circuit 123 may release the word line accessed in the previous active operation when the pre-charge signal PCG is generated.

Figure 4:
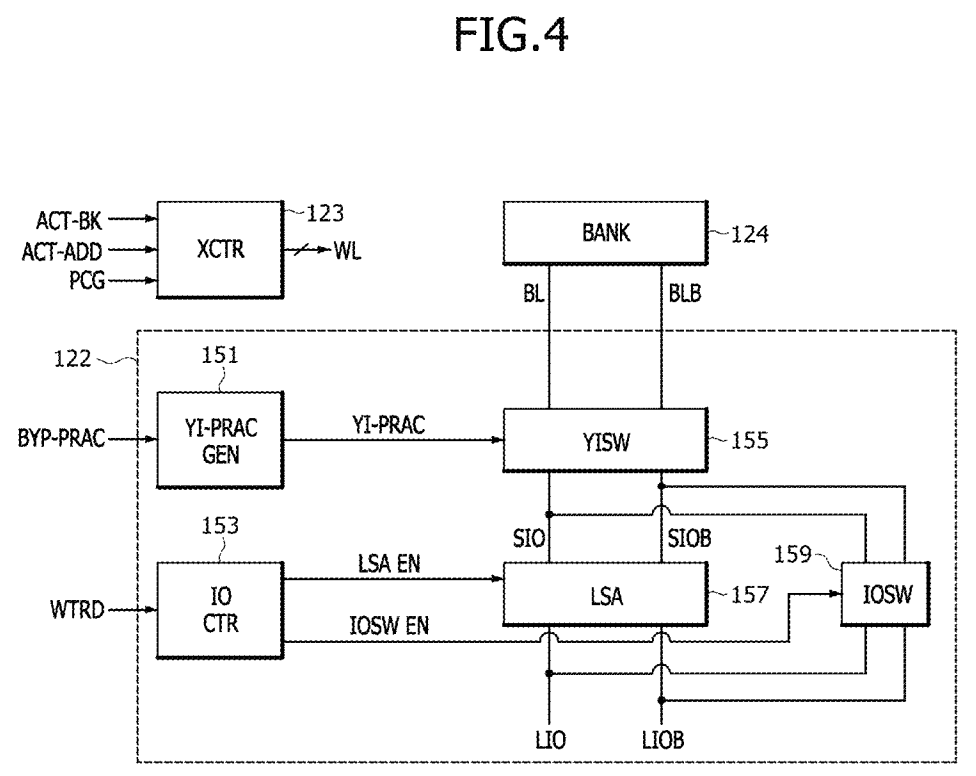

The bank 124 may include a plurality of memory cells connected to the word lines (for example, WL in FIG. 4). Data and the row counting value may be stored in the memory cells included in the bank 124. The row counting value stored in the bank 124 may be output and updated in the row access counting operation and then stored again. More specifically, when a counting read operation is performed during a period in which the column selection operation for the row access counting operation is performed, the row counting value stored in the bank 124 may be output, and when a counting write operation is performed during a period in which a column selection operation for the row access counting operation is performed, the updated row counting value may be stored again.

The input/output sense amplifier 125 may be electrically connected to the local input/output line pair LIO/LIOB to receive the signal transmitted through the local input/output line pair LIO/LIOB and may be electrically connected to the command delay circuit 113 to receive the input/output sense amplifier control signal IOSTBP-PRAC from the command delay circuit 113. The input/output sense amplifier 125 may receive the row counting value that is output from the bank 124 according to the counting read operation through the local input/output line pair LIO/LIOB when the input/output sense amplifier control signal IOSTBP-PRAC is generated and may sense and amplify the received row counting value to output the row counting value as the read data RDA.

The error correction circuit 126 may be electrically connected to the input/output sense amplifier 125 and the counting adder 115 to receive the read data RDA from the input/output sense amplifier 125 and to receive an update counting signal CNT-A from the counting adder 115. The error correction circuit 126 may correct errors included in the read data RDA to output corrected read data RDA as a counting signal CNT-B. The counting signal CNT-B may correspond to the row counting value stored in the bank 124. The error correction circuit 126 may correct errors included in the update counting signal CNT-A to generate correction data CDA. The update counting signal CNT-A may correspond to the updated row counting value. The error correction circuit 126 may be implemented to correct the errors included in signals and data using the Hamming code, the Reed-Solomon code (RS code), and the Bose-Chaudhuri-Hocquenghem code (BCH code); however, this is merely an example, and the present disclosure is not limited thereto.

The counting adder 115 may be electrically connected to the error correction circuit 126 and the command delay circuit 113 to receive the counting signal CNT-B from the error correction circuit 126 and to receive the latch pulse LPUL from the command delay circuit 113. The counting adder 115 may increase the row counting value by 1, based on the counting signal CNT-B, to generate the update counting signal CNT-A. Based on the latch pulse LPUL, the counting adder 115 may latch and output the update counting signal CNT-A.

The alert signal generation circuit 117 may be electrically connected to the counting adder 115 to receive the update counting signal CNT-A from the counting adder 115. Based on the update counting signal CNT-A, a threshold code TH-CD, and the active address ACT-ADD, the alert signal generation circuit 117 may generate the alert signal ALERT. The alert signal generation circuit 117 may store the active address ACT-ADD in an address storage circuit (for example, 143 in FIG. 3) when the row counting value corresponding to the update counting signal CNT-A reaches a threshold value corresponding to the threshold code TH-CD. The active address ACT-ADD may be set as an address input in the active operation that is performed before the pre-charge command PCG-BK is generated. The alert signal generation circuit 117 may generate the alert signal ALERT that is activated when the storage space of the address storage circuit (for example, 143 in FIG. 3) is full.

The write driver 127 may be electrically connected to the command delay circuit 113 and the error correction circuit 126 to receive the write driver control signal BWEN-PRAC from the command delay circuit 113 and to receive the correction data CDA from the error correction circuit 126. When the write driver control signal BWEN-PRAC is generated, the write driver 127 may drive the local input/output line pair LIO/LIOB, based on the correction data CDA, to transmit the correction data CDA to the column control circuit 122 through the local input/output line pair LIO/LIOB.

The write read signal generation circuit 128 may be electrically connected to the command decoder 111 and the command delay circuit 113 to receive the pre-charge command PCG-BK from the command decoder 111 and to receive the write signal WT-PRAC from the command delay circuit 113. Based on the pre-charge command PCG-BK and the write signal WT-PRAC, the write read signal generation circuit 128 may generate the write read signal WTRD. When the pre-charge command PCG-BK is generated, the write read signal generation circuit 128 may generate the write read signal WTRD so that the counting read operation is performed. When the write signal WT-PRAC is generated, the write read signal generation circuit 128 may generate the write read signal WTRD so that the counting write operation is performed. The state of the write read signal WTRD that is generated to perform the counting write operation and the state of the write read signal WTRD that is generated to perform the counting read operation may be set differently, and the states of the write read signals WTRD may be set separately by the logic level or logic bit set; however, this is merely an example, and the present disclosure is not limited thereto.

The pre-charge signal generation circuit 129 may be electrically connected to the command decoder 111 to receive the pre-charge command PCG-BK from the command decoder 111. The pre-charge signal generation circuit 129 may generate a pre-charge signal PCG at a time point at which a pre-charge delay period elapses after the pre-charge command PCG-BK is generated. Because the pre-charge operation needs to be performed after the row access counting operation is performed, it is desirable for the pre-charge delay period to be set longer than the period in which the column selection operation for the row access counting operation is performed.

Figure 3:
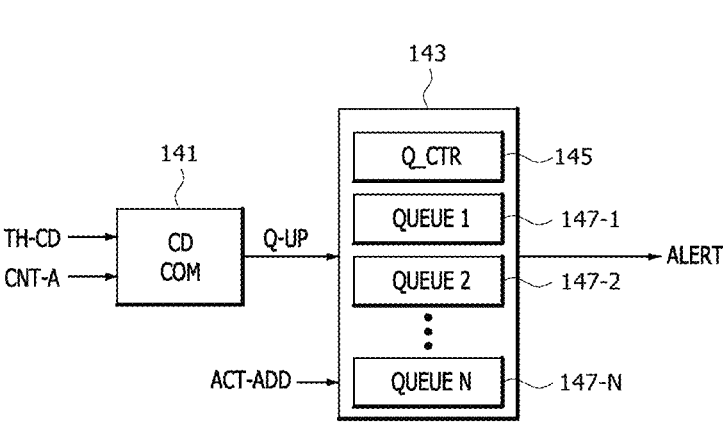
FIG. 3 illustrates a configuration of an alert signal generation circuit according to an embodiment of the present disclosure.

FIG. 3 illustrates a configuration of the alert signal generation circuit 117 of FIG. 2 according to an embodiment of the present disclosure. As shown in FIG. 3, the alert signal generation circuit 117 may include a code comparison circuit (CD COM) 141 and an address storage circuit 143.

Based on the threshold code TH-CD and the update counting signal CNT-A, the code comparison circuit 141 may generate an update signal Q-UP. The code comparison circuit 141 may compare the threshold value corresponding to the threshold code TH-CD with the row counting value corresponding to the update counting signal CNT-A to generate the update signal Q-UP. The code comparison circuit 141 may generate the update signal Q-UP that is activated when the row counting value corresponding to the update counting signal CNT-A reaches the threshold value corresponding to the threshold code TH-CD.

The address storage circuit 143 may be electrically connected to the code comparison circuit 141 to receive the update signal Q-UP from the code comparison circuit 141. Based on the update signal Q-UP and the active address ACT-ADD, the address storage circuit 143 may generate the alert signal ALERT. The address storage circuit 143 may include a queue control circuit (Q-CTR) 145 and a plurality of queues (QUEUE 1 through QUEUE N) 147-1 through 147-N. When the update signal Q-UP is activated, the queue control circuit 145 may sequentially store the active address ACT-ADD in the plurality of queues 147-1 to 147-N. When the active address ACT-ADD is stored in all queues 147-1 through 147-N, that is, when the storage space of the address storage circuit 143 is full, the queue control circuit 145 may generate the alert signal ALERT that is activated.

FIG. 4 illustrates configurations of the row control circuit 123 and the column control circuit 122 of FIG. 2 according to an embodiment of the present disclosure.

The row control circuit 123 may access at least one of the word lines WL, based on the active address ACT-ADD, when the active command ACT-BK is generated and the active operation is performed. When the pre-charge signal PCG is generated and the pre-charge operation is performed, the row control circuit 123 may release the word line that is accessed in the active operation.

The column control circuit 122 may include a counting column selection signal generation circuit (YI-PRAC GEN) 151, an input/output control circuit (IO CTR) 153, a column selection switch (YISW) 155, a sense amplifier (LSA) 157, and an input/output line switch (IOSW) 159.

The counting column selection signal generation circuit 151 may generate a counting column selection signal YI-PRAC when the column control signal BYP-PRAC for the column selection operation of the row access counting operation is generated.

The input/output control circuit 153 may generate the sense amplifier activation signal LSAEN when the write read signal WTRD for the counting read operation is generated. The input/output control circuit 153 may generate the input/output line switch activation signal IOSWEN when the write read signal WTRD for the counting write operation is generated.

The column selection switch 155 may be electrically connected to the counting column selection signal generation circuit 151 to receive the counting column selection signal YI-PRAC from the counting column selection signal generation circuit 151. The column selection switch 155 may connect the bit line pair BL/BLB and the segment input/output line pair SIO/SIOB when the counting column selection signal YI-PRAC is generated during the period in which the column selection operation for the row access counting operation is performed.

The sense amplifier 157 may be electrically connected to the input/output control circuit 153 to receive the sense amplifier activation signal LSAEN from the input/output control circuit 153. When the counting read operation is performed and the sense amplifier activation signal LSAEN is generated, the sense amplifier 157 may sense and amplify the row counting value that is output from the bank 124 and may be transmitted through the segment input/output line pair SIO/SIOB, during the counting read operation, to output the row counting value to the local input/output line pair LIO/LIOB.

The input/output line switch 159 may be electrically connected to the input/output control circuit 153 to receive the input/output line switch activation signal IOSWEN from input/output control circuit 153. When the counting write operation is performed and the input/output line switch activation signal IOSWEN is generated, the input/output line switch 159 may transmit the updated row counting value that is transmitted through the local input/output line pair LIO/LIOB to the segment input/output line pair SIO/SIOB.

Figure 5:
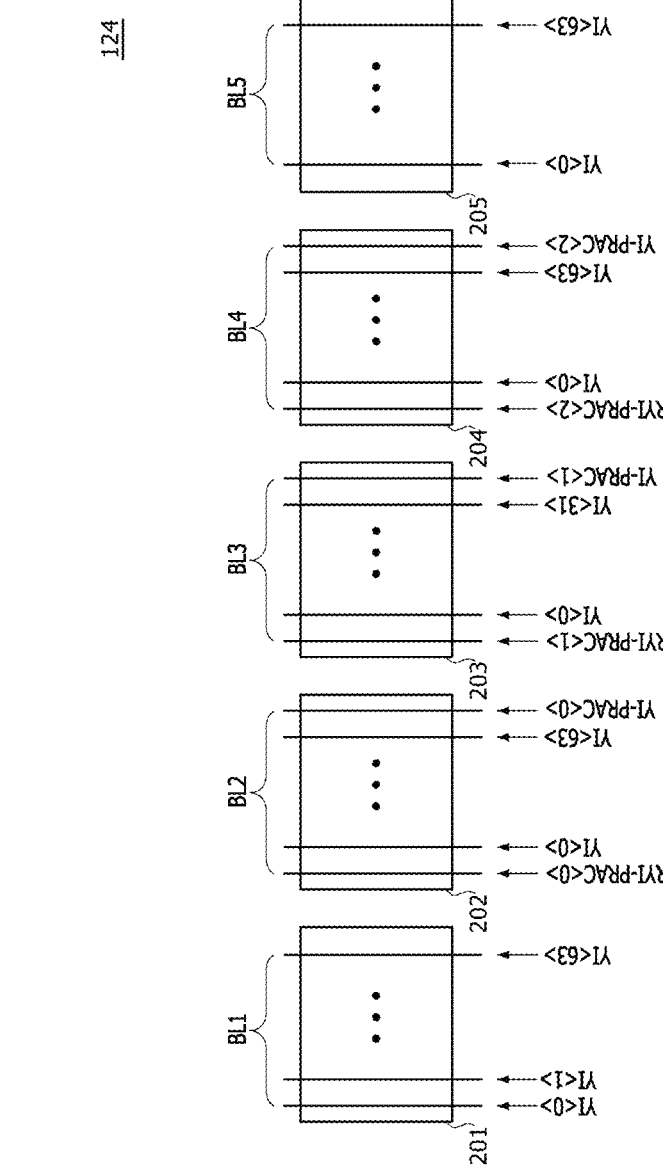
FIG. 5 illustrates a configuration of a bank according to an embodiment of the present disclosure.

FIG. 5 illustrates a configuration of the bank 124, shown in FIG. 4, according to an embodiment of the present disclosure. As shown in FIG. 5, the bank 124 may include first through fifth cell blocks 201, 202, 203, 204, and 205. Each of the first through fifth cell blocks 201, 202, 203, 204, and 205 may be referred to as a mat.

The first cell block 201 may include a plurality of memory cells connected to a first bit line set BL1. The first bit line set BL1 of the first cell block 201 may include 64 bit lines selected by first through $64^{th}$ column selection signals YI<0:63>. When the column selection operation for the write operation and the read operation is performed, at least one of the 64 bit lines included in the first bit line set BL1 of the first cell block 201 may be selected by the first through $64^{th}$ column selection signals YI<0:63>. Normal data input and output during the write operation and read operation may be stored in the plurality of memory cells connected to the first bit line set BL1 of the first cell block 201; however, this is merely an example and the present disclosure is not limited thereto.

The second cell block 202 may include a plurality of memory cells connected to a second bit line set BL2. The second bit line set BL2 of the second cell block 202 may include 64 bit lines selected by the first through $64^{th}$ column selection signals YI<0:63>, a counting bit line selected by the first counting column selection signal YI-PRAC<0>, and a redundancy counting bit line selected by a first redundancy counting column selection signal RYI-PRAC<0>. When the column selection operation for the write operation or read operation is performed, at least one of the 64 bit lines included in the second bit line set BL2 of the second cell block 202 may be selected by the first through $64^{th}$ column selection signals YI<0:63>. Parity data used in an error correction operation may be stored in the plurality of memory cells that is connected to the 64 bit lines included in the second bit line set BL2 of the second cell block 202; however, this is merely an example and the present disclosure is not limited thereto. When the row access counting operation is performed, the second cell block 202 may select the counting bit line based on the first counting column selection signal YI-PRAC<0>. The row counting values may be stored in the plurality of memory cells connected to the counting bit line of the second cell block 202. The second cell block 202 may select the redundancy counting bit line, based on the first redundancy counting column selection signal RYI-PRAC<0>, when the row access counting operation is being performed while a defect is detected in the counting bit line. The row counting values may be stored in the plurality of memory cells connected to the redundancy counting bit line of the second cell block 202.

The third cell block 203 may include a plurality of memory cells connected to a third bit line set BL3. The third bit line set BL3 of the third cell block 203 may include 32 bit lines selected by the first through $32^{nd}$ column selection signals YI<0:31>, a counting bit line selected by the second counting column selection signal YI-PRAC<1>, and a redundancy counting bit line selected by a second redundancy counting column selection signal RYI-PRAC<1>. When the column selection operation for the write operation or read operation is performed, at least one of the 32 bit lines included in the third bit line set BL3 of the third cell block 203 may be selected by the first through $32^{nd}$ column selection signals YI<0:31>. Redundancy data used in a repair operation may be stored in the plurality of memory cells connected to 32 bit lines included in the third bit line set BL3 of the third cell block 203; however, this is merely an example and the present disclosure is not limited thereto. The third cell block 203 may select the counting bit line, based on the second counting column selection signal YI-PRAC<1>, when the row access counting operation is performed. The row counting values may be stored in the plurality of memory cells connected to the counting bit line of the third cell block 203. The third cell block 203 may select the redundancy counting bit line, based on the second redundancy counting column selection signal RYI-PRAC<1>, when the row access counting operation is being performed while a defect is detected in the counting bit line. The row counting values may be stored in the plurality of memory cells connected to the redundancy counting bit line of the third cell block 203.

The fourth cell block 204 may include a plurality of memory cells connected to a fourth bit line set BL4. The fourth bit line set BL4 of the fourth cell block 204 may include 64 bit lines selected by the first through $64^{th}$ column selection signals YI<0:63>, a counting bit line selected by the third counting column selection signal YI-PRAC<2>, and the redundancy counting bit line selected by a third redundancy counting column selection signal RYI-PRAC<2>. When the column selection operation for the write operation or read operation is performed, at least one of the 64 bit lines included in the fourth bit line set BL4 of the fourth cell block 204 may be selected by the first through $64^{th}$ column selection signals YI<0:63>. The parity data used in the error correction operation may be stored in the plurality of memory cells connected to the 64 bit lines included in the fourth bit line set BL4 of the fourth cell block 204; however, this is merely an example and the present disclosure is not limited thereto. The fourth cell block 204 may select the counting bit line, based on the third counting column selection signal YI-PRAC<2>, when the row access counting operation is performed. The row counting values may be stored in the plurality of memory cells connected to the counting bit line of the fourth cell block 204. The fourth cell block 204 may select the redundancy counting bit line, based on the third redundancy counting column selection signal RYI-PRAC<2>, when the row access counting operation is being performed while a defect is detected in the counting bit line. The row counting values may be stored in the plurality of memory cells connected to the redundancy counting bit line of the fourth cell block 204.

The fifth cell block 205 may include a plurality of memory cells connected to a fifth bit line set BL5. The fifth bit line set BL5 of the fifth cell block 205 may include 64 bit lines selected by the first through $64^{th}$ column selection signals YI<0:63>. When the column selection operation for the write operation or read operation is performed, at least one of the 64 bit lines included in the fifth bit line set BL5 of the fifth cell block 205 may be selected by the first through $64^{th}$ column selection signals YI<0:63>. Normal data input and output in the write and read operations may be stored in the plurality of memory cells, connected to the 64 bit lines, included in the fifth bit line set BL5 of the fifth cell block 205; however, this is merely an example and the present disclosure is not limited thereto.

When the counting read operation is performed in the row access counting operation for the bank 124, the row counting values stored in memory cells, connected to the counting bit line, selected by the first through third counting column selection signals YI-PRAC<0:2> may be output. When the counting write operation is performed in the row access counting operation, the updated row counting value may be stored in the memory cells connected to the counting bit line selected by the first through third counting column selection signals YI-PRAC<0:2>.

FIGS. 6, 7, 8, 9, and 10 are diagrams illustrating the row access counting operation performed in the memory device 110, shown in FIG. 2, according to an embodiment of the present disclosure.

Figure 6:
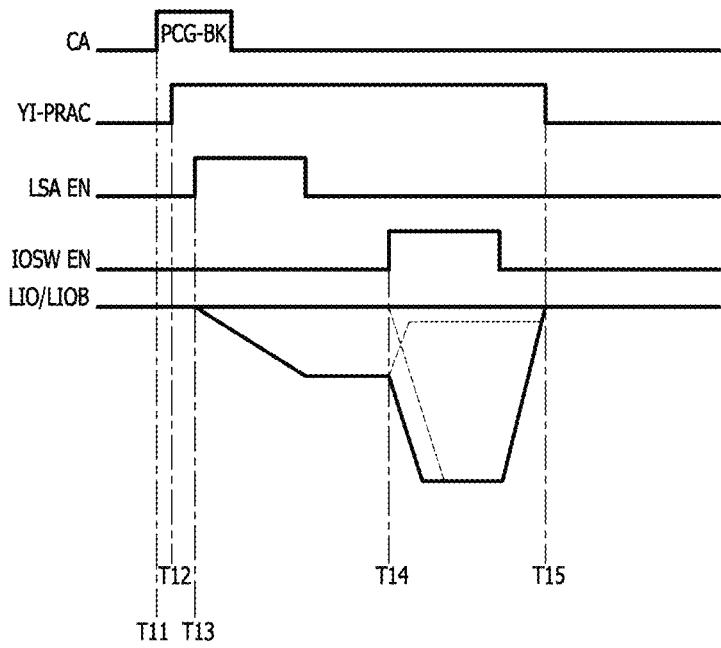
Figure 7:
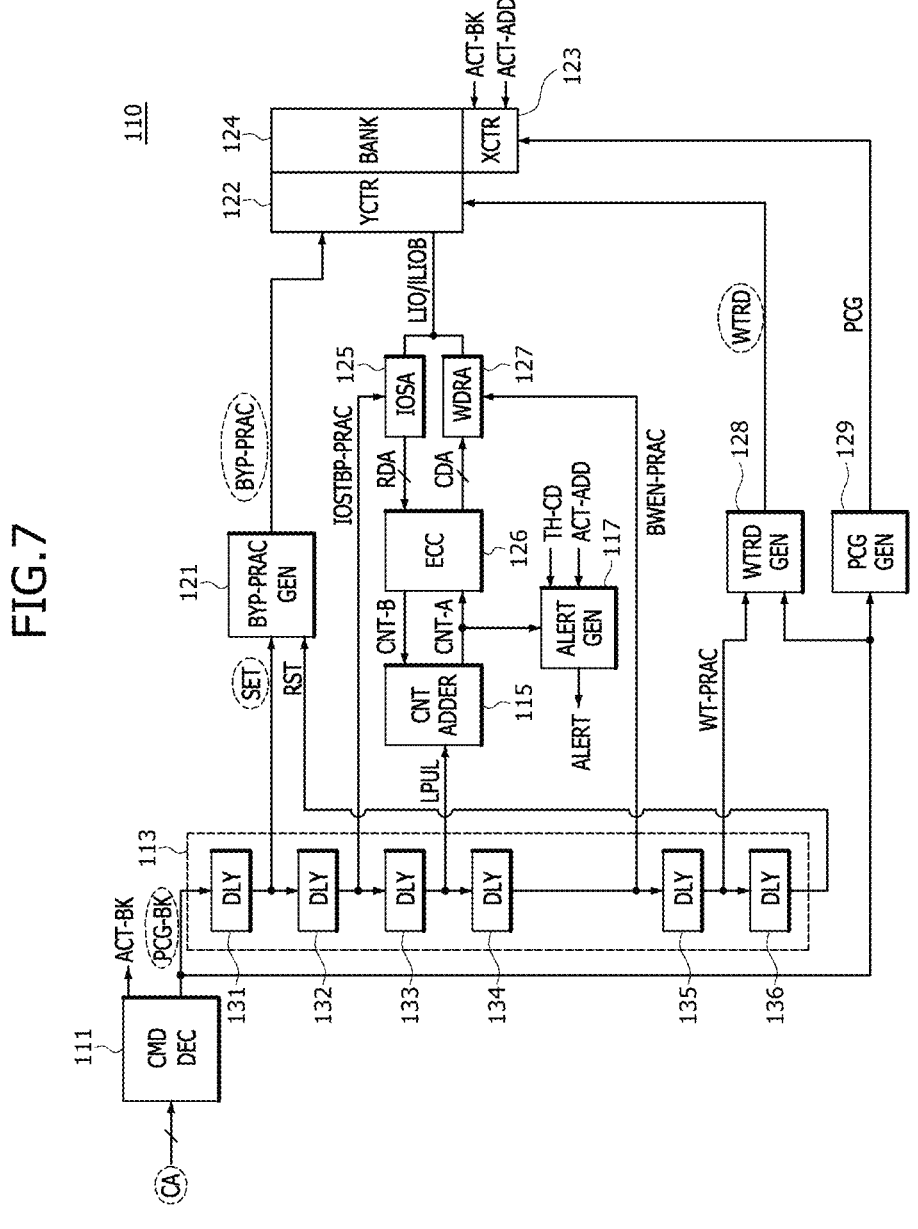

First, as shown in FIGS. 6 and 7, when the command address CA is decoded and the pre-charge command PCG-BK for the pre-charge operation is generated in the command decoder 111 at a time point T11, the column control signal BYP-PRAC may be generated for the column selection operation of the row access counting operation, and the write read signal WTRD may be generated for the counting read operation. More specifically, the command delay circuit 113 may delay the pre-charge command PCG-BK by the first delay period to generate the set signal SET, and the column control signal generation circuit 121 may generate the column control signal BYP-PRAC for the column selection operation of the row access counting operation when the set signal SET is generated. Additionally, the write read signal generation circuit 128 may generate the write read signal WTRD so that the counting read operation is performed when the pre-charge command PCG-BK is generated.

Figure 8:
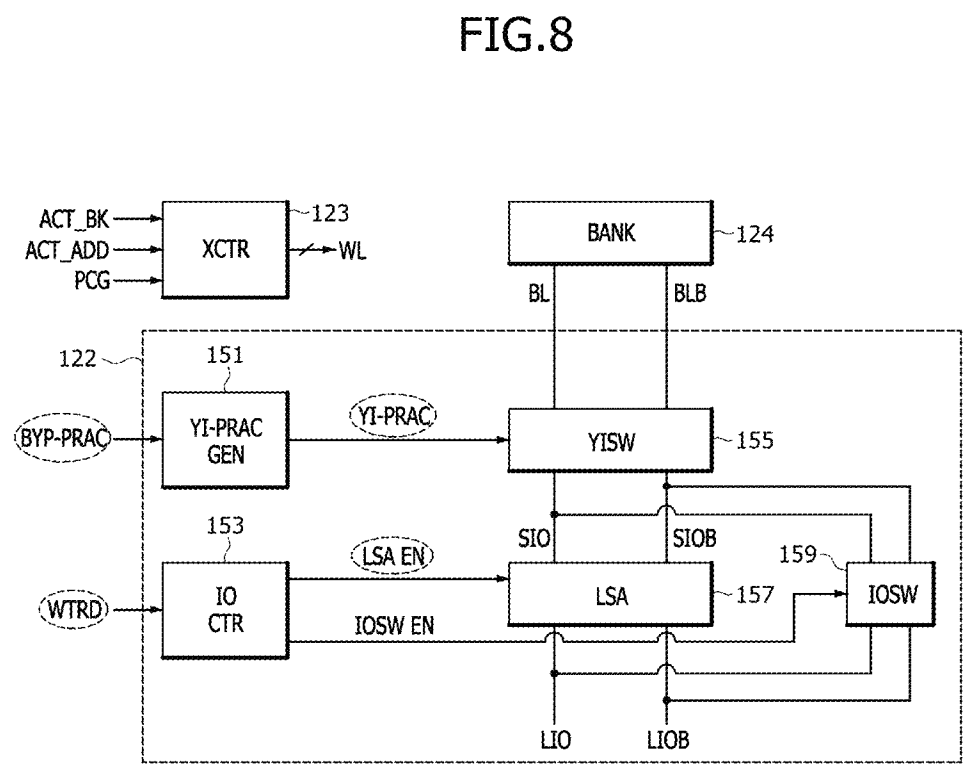

Next, as shown in FIGS. 6 and 8, the column selection operation and counting read operation in the row access counting operation may be performed based on the column control signal BYP-PRAC and the write read signal WTRD. More specifically, when the column control signal BYP-PRAC is generated at a time point T12, the counting column selection signal generation circuit 151 may generate the counting column selection signal YI-PRAC during the period T12-T15 in which the column selection operation for the row access counting operation is performed, and the column selection switch 155 may connect the bit line pair BL/BLB with the segment input/output line pair SIO/SIOB during the period T12-T15 in which the counting column selection signal YI-PRAC is generated. In addition, when the write read signal WTRD is generated for the counting read operation, the input/output control circuit 153 may generate the input/output line switch activation signal IOS-WEN at a time point T13, and when the counting read operation is performed and the sense amplifier activation signal LSAEN is generated, the sense amplifier 157 may sense and amplify the row counting value that is output from the bank 124 and may be transmitted through the segment input/output line pair SIO/SIOB during the counting read operation and may output the row counting value to the local input/output line pair LIO/LIOB. To summarize, when the column selection operation and counting read operation for the row access counting operation are performed, the row counting value output from the bank 124 may be transmitted from the bit line pair BL/BLB to the segment input/output line pair SIO/SIOB through the column selection switch 155, and the row counting value transmitted through the segment input/output line pair SIO/SIOB ma y be sensed, amplified, and output to the local input/output line pair LIO/LIOB by the sense amplifier 157.

Figure 9:
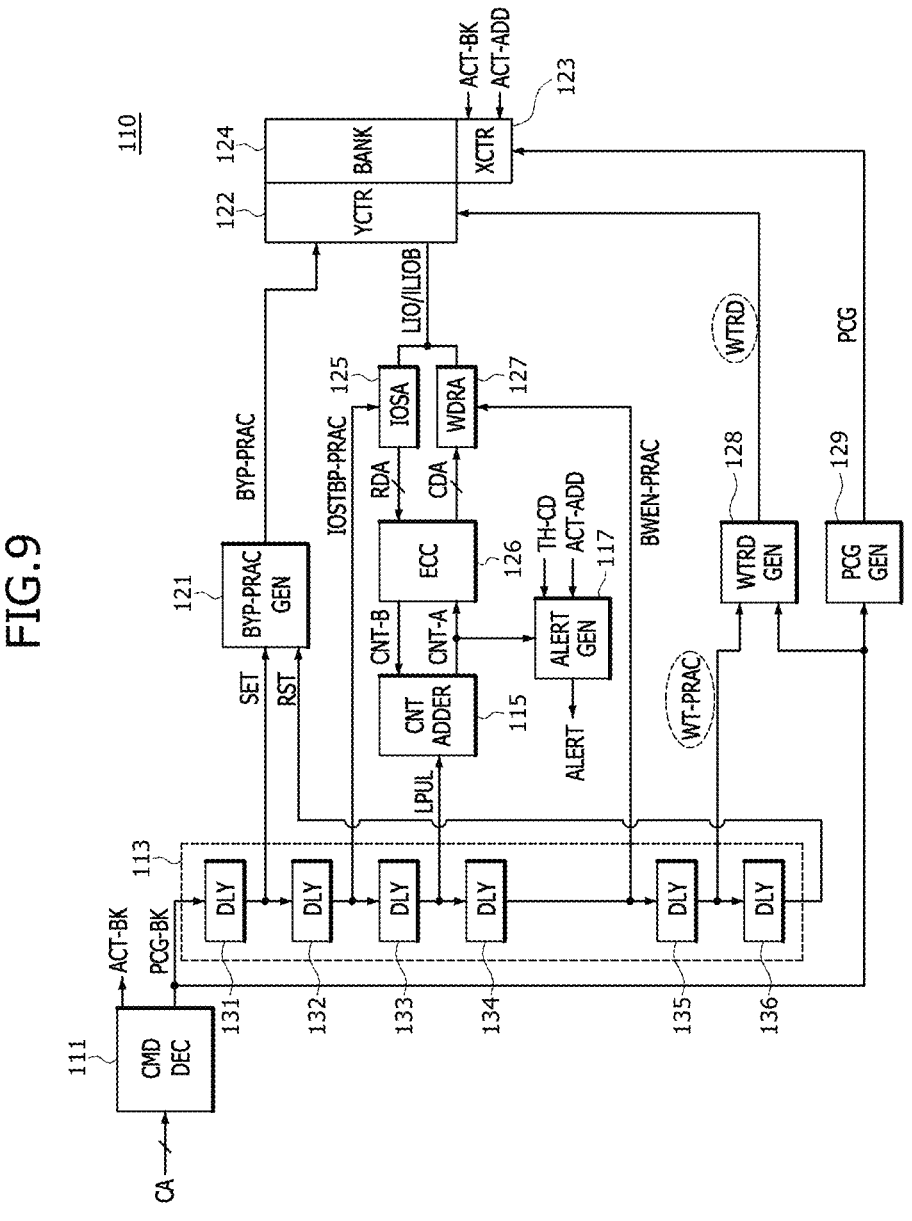

Next, as shown in FIG. 9, when the write signal WT-PRAC is generated in the command delay circuit 113, the write read signal generation circuit 128 may generate the write read signal WTRD for the counting write operation.

Figure 10:
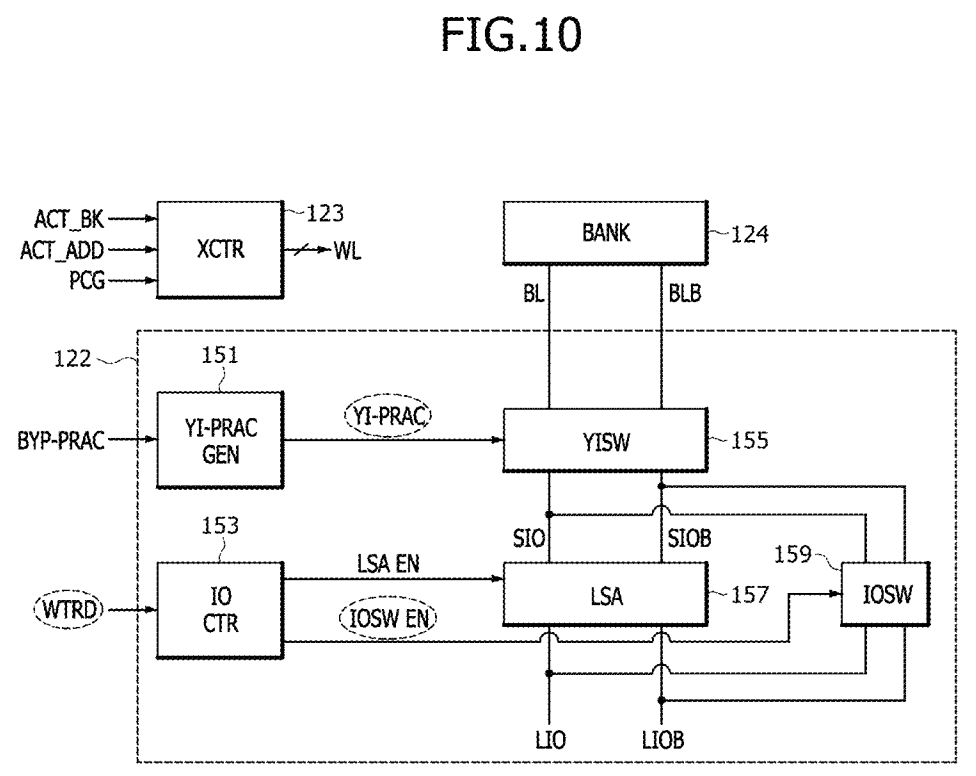

Next, as shown in FIGS. 6 and 10, the counting write operation may be performed based on the column control signal BYP-PRAC and the write read signal WTRD. More specifically, the input/output control circuit 153 may generate the input/output line switch activation signal IOSWEN at a time point T14 when the write read signal WTRD is generated for the counting write operation, and the input/output line switch 159 may connect the segment input/output line pair SIO/SIOB with the local input/output line pair LIO/LIOB based on the input/output line switch activation signal IOSWEN so that the updated row counting value received through the local input/output line pair LIO/LIOB is transmitted to the segment input/output line pair SIO/SIOB when the counting write operation is performed. The column selection switch 155 may transmit the updated row counting value transmitted through the segment input/output line pair SIO/SIOB, based on the counting column selection signal YI-PRAC, to the bit line pair BL/BLB to store the updated row counting value in the bank 124 when the counting write operation is performed. To summarize, when the counting write operation in the row access counting operation is performed, the updated row counting value received through the local input/output line pair LIO/LIOB may be transmitted through the bit line pair BL/BLB through the column selection switch 155 and the input/output line switch 159 and may be stored in the bank 124.

When the row access counting operation that updates the row counting value based on the pre-charge command PCG-BK is performed in the memory device 110 discussed above, the counting read operation that outputs the row counting value in the bank 124 and the counting write operation that stores the updated row counting value in the bank 124 may be performed during the period in which the column selection operation for the row access counting operation is performed. Accordingly, the counting column selection signal YI-PRAC might not be generated separately for the counting read operation and the counting write operation, and there may be no need to pre-charge the local input/output line pair LIO/LIOB, thereby reducing current consumption.

Figure 11:
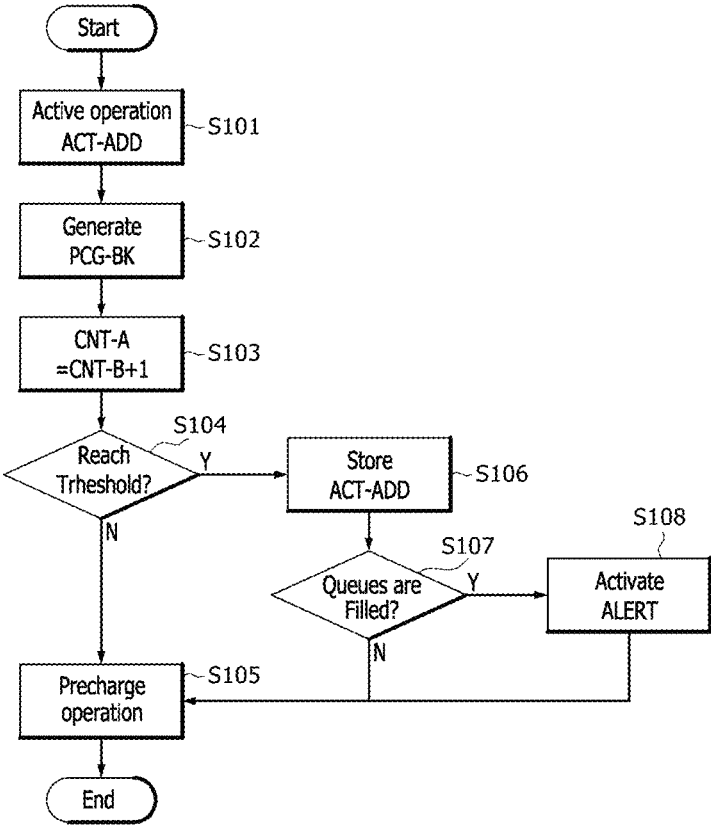
FIGS. 11, 12, and 13 are diagrams illustrating an alert signal generating operation performed in a memory device according to an embodiment of the present disclosure.
Figure 12:
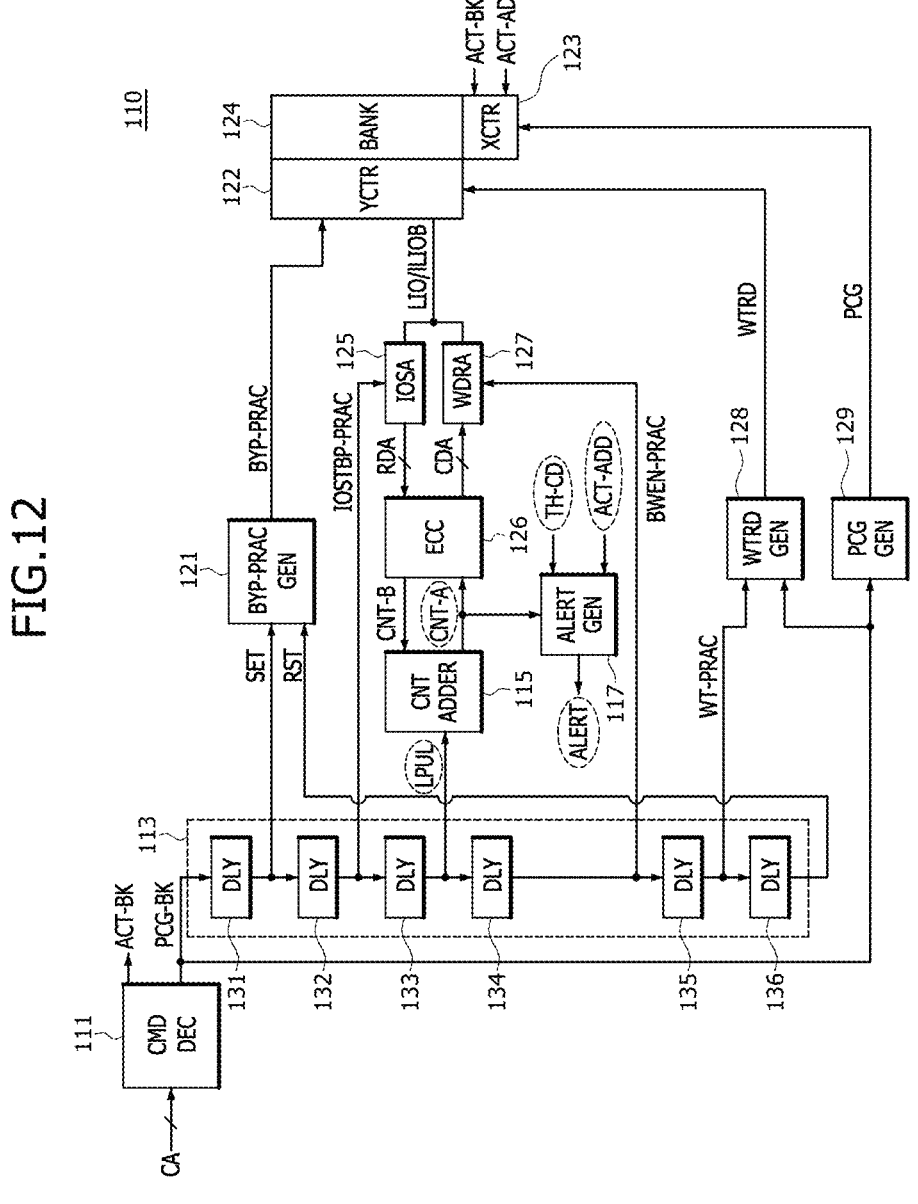
Figure 13:
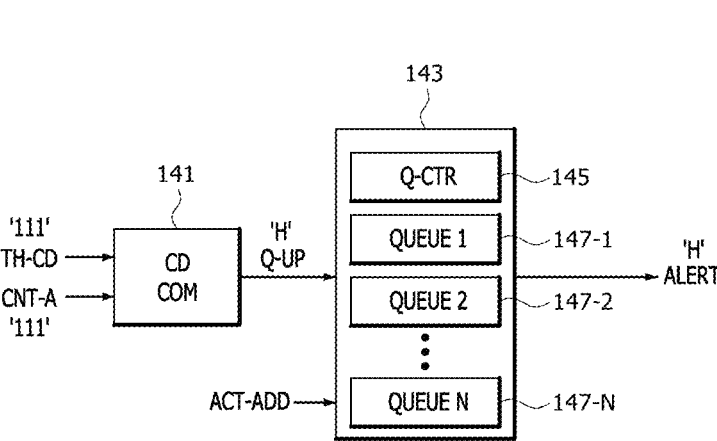

FIGS. 11, 12, and 13 are diagrams illustrating an alert signal generating operation performed in the memory device 110 of FIG. 2 according to an embodiment of the present disclosure.

First, as shown in FIGS. 11 and 12, the command decoder 111 may decode the command address CA to generate the active command ACT-BK to perform the active operation on the memory cells accessed by the active address ACT-ADD in the bank 124 (S101). The command decoder 111 may generate the pre-charge command PCG-BK for the pre-charge operation after the active operation (S102). When the pre-charge command PCG-BK is delayed in the command delay circuit 113 and the latch pulse LPUL is generated, the counting adder 115 may increase the row counting value that is output from the bank 124 by 1 through a counting read operation to generate an update counting signal CNT-A with an updated row counting value (S103). Based on the update counting signal CNT-A, the threshold code TH-CD, and the active address ACT-ADD, the alert signal generation circuit 117 may generate the alert signal ALERT.

Next, as shown in FIGS. 11 and 12, the alert signal generation circuit 117 may determine whether the row counting value corresponding to the update counting signal CNT-A reaches the threshold value corresponding to the threshold code TH-CD (S104) to generate the alert signal ALERT. When the row counting value does not reach the threshold value, the row control circuit 123 may perform the pre-charge operation to release the word line accessed in the active operation (S105).

As shown in FIGS. 11, 12, and 13, the code comparison circuit 141 may compare the threshold value corresponding to the threshold code TH-CD with the row counting value corresponding to the update counting signal CNT-A to generate the update signal Q-UP. More specifically, because the row counting value corresponding to the update counting signal CNT-A is set to a binary bit set '111' and reaches the binary bit set '111', which is the threshold value corresponding to the threshold code TH-C, the code comparison circuit 141 may generate the update signal Q-UP that is activated at a logic "high" level 'H'. The address storage circuit 143 may sequentially store the active address ACT-ADD in the queues 147-1 to 147-N when the update signal Q-UP is activated (S106). When it is determined that the active address ACT-ADD is stored in all queues 147-1 through 147-N (S107), the address storage circuit 143 may activate the alert signal ALERT at a logic "high" level 'H' (S108). The row control circuit 123 may perform the pre-charge operation after storing the active address ACT-ADD or generating the activated alert signal ALERT (S105).

According to the memory device 110 described above, in the row access counting operation, when the updated row counting value reaches the threshold value and the active address ACT-ADD is stored in the address storage circuit 143, the alert signal ALERT may be generated when the address storage circuit 143 is full, thereby managing the loss of charge from the memory cells.

Concepts are disclosed in conjunction with various embodiments as described above. Those skilled in the art will understand that various modifications, additions, and substitutions are possible, without departing from the scope and spirit of the present disclosure. Accordingly, the embodiments disclosed in the present specification should not be considered from a restrictive standpoint but rather from an illustrative standpoint. The scope of the present disclosure is not limited to the above descriptions, and all of distinctive features within an equivalent scope should be construed as being included in the present disclosure.

What is claimed is:

1. A memory device comprising:
   a bank configured to store a row counting value corresponding to the number of times each word line is accessed when an active operation is performed; and
   a column control circuit configured to perform a counting read operation and a counting write operation during a period in which a column selection operation set by a pre-charge command is performed,
   wherein the column control circuit is configured to:
      output the row counting value stored in the bank to a local input/output line pair when the counting read operation is performed, and
      store an updated row counting value transmitted through the local input/output line pair in the bank when the counting write operation is performed.

2. The memory device of claim 1, wherein the pre-charge command is generated to perform a pre-charge operation after the active operation.

3. The memory device of claim 1, wherein the pre-charge command is generated to perform a pre-charge operation after a read operation or a write operation is performed, the read operation or the write operation being performed after the active operation.

4. The memory device of claim 1, wherein the pre-charge command is generated to perform a pre-charge operation along with a read operation or a write operation, the pre-charge operation with the read operation or the pre-charge operation with the write operation being performed after the active operation.

5. The memory device of claim 1, wherein the column control circuit comprises:
a counting column selection signal generation circuit configured to generate a counting column selection signal, based on a column control signal generated by the pre-charge command;
an input/output control circuit configured to generate a sense amplifier activation signal when a write read signal for the counting read operation is generated and configured to generate an input/output line switch activation signal when the write read signal for the counting write operation is generated;
a column selection switch configured to connect a bit line pair with a segment input/output line pair during a period in which the column selection operation is performed based on the counting column selection signal;
a sense amplifier configured to sense and amplify a row counting value transmitted through the segment input/output line pair, based on the sense amplifier activation signal, to output an amplified row counting value to the local input/output line pair; and
an input/output line switch configured to, based on the input/output line switch activation signal, transmit the updated row counting value, received through the local input/output line pair, to the segment input/output line pair.

6. The memory device of claim 1, further comprising a row control circuit configured to access at least one of the word lines, based on an active address when the active operation is performed, and configured to release the word line accessed in the active operation when a pre-charge operation is performed.

7. The memory device of claim 1, further comprising an alert signal generation circuit configured to generate an alert signal depending on whether the active address can be stored when the updated row counting value reaches a threshold value.

8. The memory device of claim 7, wherein the alert signal generation circuit comprises:
a code comparison circuit configured to compare an update counting signal corresponding to the updated row counting value and a threshold code corresponding to the threshold value to generate an update signal; and
an address storage circuit comprising a plurality of queues configured to sequentially store the active address, based on the update signal, and configured to generate the alert signal when the active address is stored in all of the plurality of queues.

9. A memory device comprising:
a command delay circuit configured to delay a pre-charge command to sequentially generate a set signal, a write signal, and a reset signal;
a column control signal generation circuit configured to generate a column control signal for a column selection operation, based on the set signal and the reset signal;
a write read signal generation circuit configured to generate a write read signal, based on the pre-charge command and the write signal; and
a column control circuit configured to perform a counting read operation and a counting write operation during a period in which a column selection operation is performed based on the column control signal and the write read signal, wherein the column control circuit is configured to:
output a row counting value stored in a bank to a local input/output line pair when the counting read operation is performed, and,
store an updated row counting value transmitted through the local input/output line pair in the bank when the counting write operation is performed.

10. The memory device of claim 9, wherein the command delay circuit is configured to:
delay the pre-charge command by a first delay period to generate the set signal,
delay the set signal by a second delay period to generate the write signal, and
delay the write signal by a third delay period to generate the reset signal.

11. The memory device of claim 9, wherein the column control signal generation circuit is configured to generate the column control signal during a period in which the column selection operation is performed, which is set from when the set signal is generated until the reset signal is generated.

12. The memory device of claim 9, wherein the write read signal generation circuit is configured to:
generate the write read signal to perform the counting read operation when the pre-charge command is generated, and
generate the write read signal to perform the counting write operation when the write signal is generated.

13. The memory device of claim 9, wherein the column control circuit comprises:
a counting column selection signal generation circuit configured to generate a counting column selection signal, based on the column control signal;
an input/output control circuit configured to generate a sense amplifier activation signal when the write read signal for the counting read operations is generated and configured to generate an input/output line switch activation signal when the write read signal for the counting write operations is generated;
a column selection switch configured to connect a bit line pair with a segment input/output line pair during a period in which the column selection operation is performed based on the counting column selection signal;
a sense amplifier configured to sense and amplify a row counting value transmitted through the segment input/output line pair, based on the sense amplifier activation signal, and configured to output an amplified row counting value to the local input/output line pair; and
an input/output line switch configured to transmit the updated row counting value received through the local input/output line pair to the segment input/output line pair, based on the input/output line switch activation signal.

14. The memory device of claim 9, wherein the command delay circuit is configured to delay the set signal to sequentially generate an input/output sense amplifier control signal, a latch pulse, and a write driver control signal.

15. The memory device of claim 14, further comprising an input/output sense amplifier configured to sense and amplify the row counting value received through the local input/output line pair to output the row counting value as read data, based on the input/output sense amplifier control signal.

16. The memory device of claim 15, further comprising an error correction circuit configured to:
receive the read data, output a counting signal generated by correcting an error included in the read data, receive an update counting signal, and output a correction data generated by correcting an error included in the update counting signal.

17. The memory device of claim 16, further comprising a counting adder configured to:

receive the counting signal, update a row counting value corresponding to the counting signal by adding a value to the row counting value, generate the update counting signal corresponding to the updated row counting value, and latch the update counting signal based on the latch pulse.

18. The memory device of claim 16, further comprising a write driver configured to drive the local input/output line pair, based on the correction data when the write driver control signal is generated.

19. The memory device of claim 9, further comprising an alert signal generation circuit configured to generate an alert signal depending on whether an active address can be stored, when the updated row counting value reaches a threshold value.

20. The memory device of claim 19, wherein the alert signal generation circuit comprises:

a code comparison circuit configured to compare an update counting signal corresponding to the updated row counting value and a threshold code corresponding to the threshold value to generate an update signal; and an address storage circuit comprising a plurality of queues configured to sequentially store the active address, based on the update signal, and configured to generate the alert signal when the active address is stored in all of the plurality of queues.

21. A method of performing a row access counting operation, the method comprising:

generating a column control signal for a column selection operation when a first delay period elapses from a time at which a pre-charge command is generated;

performing a counting read operation to output a row counting value stored in a bank in the column selection operation;

updating a row counting value that is output during the counting read operation; and performing a counting write operation that stores the updated row counting value back in the bank when a second delay period elapses from a time at which the pre-charge command is generated.

22. The method of claim 21, further comprising performing the column selection operation that connects a bit line pair with a segment input/output line pair, based on the column control signal.

23. The method of claim 21, further comprising, when the counting read operation is performed, sensing and amplifying a row counting value transmitted through a segment input/output line pair to output the row counting value to a local input/output line pair.

24. The method of claim 21, further comprising, when the counting write operation is performed, transmitting the updated row counting value received through the local input/output line pair to the segment input/output line pair.

25. The method of claim 21, further comprising generating an alert signal depending on whether an active address can be stored when the updated row counting value reaches a threshold value.

\* \* \* \* \*